(12) United States Patent
Park et al.

(10) Patent No.: US 6,479,399 B2
(45) Date of Patent: Nov. 12, 2002

(54) METHOD OF FORMING INTERLEVEL DIELECTRIC LAYER OF SEMICONDUCTOR DEVICE

(75) Inventors: Wan-jae Park, Suwon; Gyung-jin Min, Seoul; Jeong-sic Jeon, Kyungki-do, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/885,091

(22) Filed: Jun. 21, 2001

(65) Prior Publication Data

US 2002/0064936 A1 May 30, 2002

(30) Foreign Application Priority Data

Nov. 27, 2000 (KR) ........................................ 2000-71033

(51) Int. Cl.[7] .................. H01L 21/4763; H01L 21/302; H01L 21/31
(52) U.S. Cl. ...................... 438/738; 438/623; 438/624; 438/706; 438/781; 438/787
(58) Field of Search ................................. 438/624, 623, 438/738, 740–743, 706, 710, 778, 714, 780–783, 787–790

(56) References Cited

U.S. PATENT DOCUMENTS 5,310,720 A * 5/1994 Shin et al.

* cited by examiner

*Primary Examiner*—Ha Tran Nguyen
(74) *Attorney, Agent, or Firm*—Volentine Francos, PLLC

(57) ABSTRACT

A method of forming an interlevel dielectric layer of a semiconductor device includes filling the gap between conductive lines without the generation of voids or cracks. In the method of forming the interlevel dielectric layer of the semiconductor device, a conductive line is formed on a semiconductor substrate. A polysilazane-family SOG layer is deposited on the semiconductor substrate on which the conductive line is formed. The polysilazane-family SOG layer is baked and etched back until the upper part of the conductive line is exposed using a C-F-family gas having a high C to F ratio, resulting in high etch selectivity ratio of the SOG layer to a silicon nitride layer. A silicon oxide layer, serving as an interlevel dielectric layer, is formed by thermally treating the polysilazane-family SOG layer remaining after the etch back process.

14 Claims, 2 Drawing Sheets

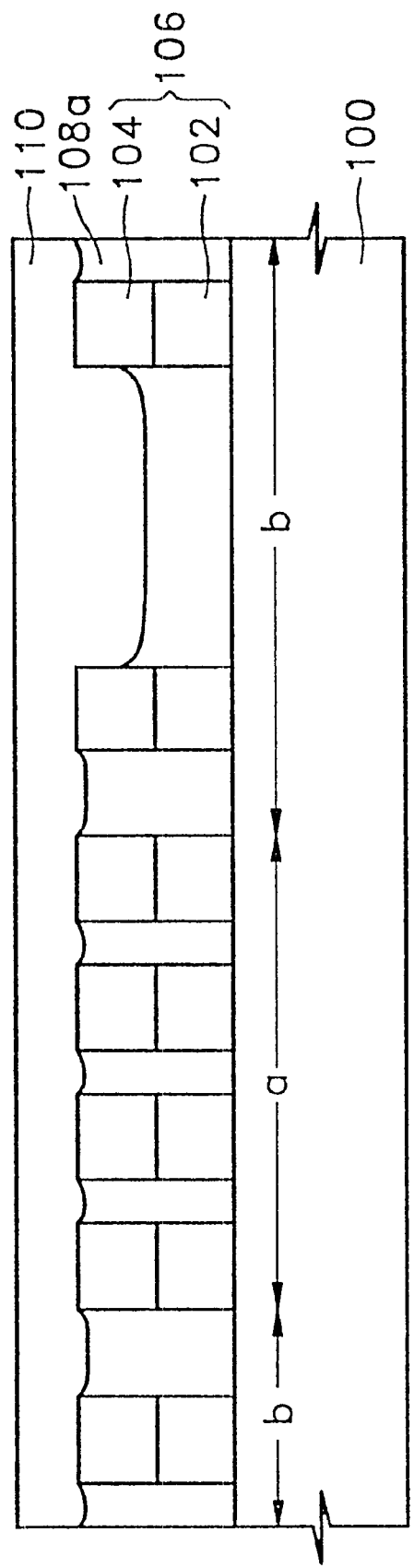

METHOD OF FORMING INTERLEVEL DIELECTRIC LAYER OF SEMICONDUCTOR DEVICE

CROSS-REFERENCES TO RELATED APPLICATIONS

The present application claims priority under 35 U.S.C. § 119 to Korean Patent Application No. 2000-71003 filed on Nov. 27, 2000.

BACKGROUND OF THE INVENTION

1. Field of the Invention

The present invention relates to a method of forming a semiconductor device, and more particularly, to a method of forming an interlevel dielectric layer of a semiconductor device.

2. Description of the Related Art

As the integration density of semiconductor devices has increased, the size of lines has been reduced and the gap between lines has been narrowed. An interlevel dielectric layer formed between lines is required to serve as insulation and should not be changed in a subsequent thermal process. Also, the interlevel dielectric layer is required to have an excellent flatness, and a low dielectric constant to reduce parasitic capacitance between adjacent lines. However, a conventional dielectric layer formed between lines, such as an undoped silicate glass (USG) layer, high density plasma (HDP) layer or plasma enhanced-tetra ethyl ortho silicate (PE-TEOS) layer, has an inferior gap fill property. Namely, in a deposition process for forming an interlevel dielectric layer, voids or crevices are generated therein.

SUMMARY OF THE INVENTION

The present invention is therefore directed to forming an interlevel dielectric layer which substantially overcomes one or more of the problems due to the limitations and disadvantages of the related art.

To solve the above problems, it is an object of the present invention to provide a method of forming an interlevel dielectric layer of a semiconductor device capable of filling the gap between conductive lines to prevent the generation of voids or cracks.

Accordingly, to achieve the above object, in the method of forming the interlevel dielectric layer of the semiconductor device, a conductive line is formed on a semiconductor substrate. Sequentially, a polysilazane-family spin on glass (SOG) layer is deposited on the semiconductor substrate on which the conductive line is formed. Next, the polysilazane-family SOG layer is baked and then etched back until the upper part of the conductive line is exposed. A silicon oxide layer is formed by thermally treating the polysilazane-family SOG layer remaining after the etch back process. The conductive line has a structure in which a hard mask layer made of silicon nitride is stacked on a conductive layer made of polysilicon, silicide or polycide. A spacer is formed at the side wall of the conductive line between the formation of the conductive line and the deposition of the SOG layer. The polysilazane-family SOG layer is soft baked at a temperature of about 50–300° C. and hard baked at a temperature of about 300–500° C. In etching back the polysilazane-family SOG layer a C-F-family gas, which gives an etch selectivity ratio of the polysilazane-family SOG layer to the silicon nitride layer of more than 10 to 1 and has a C to F ratio of at least 0.5, is used as an etch back gas. It is preferable that the C-F family gas is one selected from the group consisting of $C_5F_8$, $C_4F_8$, $C_4F_6$, or $CH_2F_2$. The thermal treatment is performed under an atmosphere of $O_2$, $H_2O$ or a combination of both at a temperature of about 600–1200° C. for about 10–20 minutes. After the thermal treatment, a dielectric layer is deposited and planarized.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The above objective and advantages of the present invention will become more apparent by describing in detail a preferred embodiment thereof with reference to the attached drawings in which:

FIGS. 1 to 3 are cross-sectional views illustrating steps of a method of forming an interlevel dielectric layer of a semiconductor device according to an embodiment of the present invention.

DETAILED DESCRIPTION OF EMBODIMENTS

Figure 1:
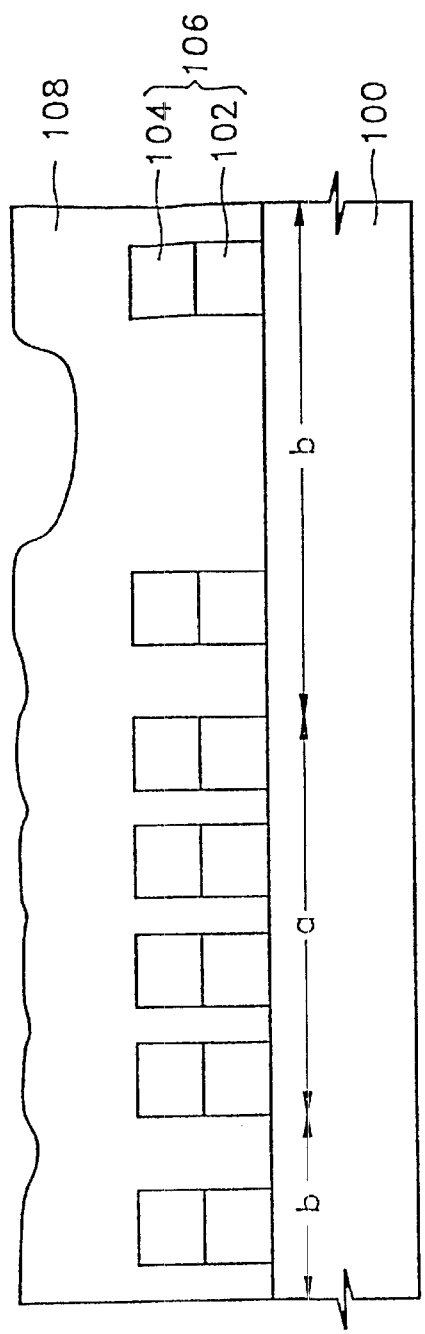

Hereinafter, an embodiment of the present invention will be described in detail with reference to the attached drawings. However, the embodiment of the present invention is provided to more completely explain the present invention to those skilled in the art, and the scope of the present invention must not be interpreted as being restricted to the embodiment. When it is written that a layer is formed "on" another layer or a substrate, the layer can be formed directly on the other layer or the substrate, or other layers can intervene therebetween. Also, in drawings, the thicknesses or sizes of layers or regions are exaggerated for the convenience of description and clarity. Like reference numerals in the drawings denote the same members.

Figure 2:
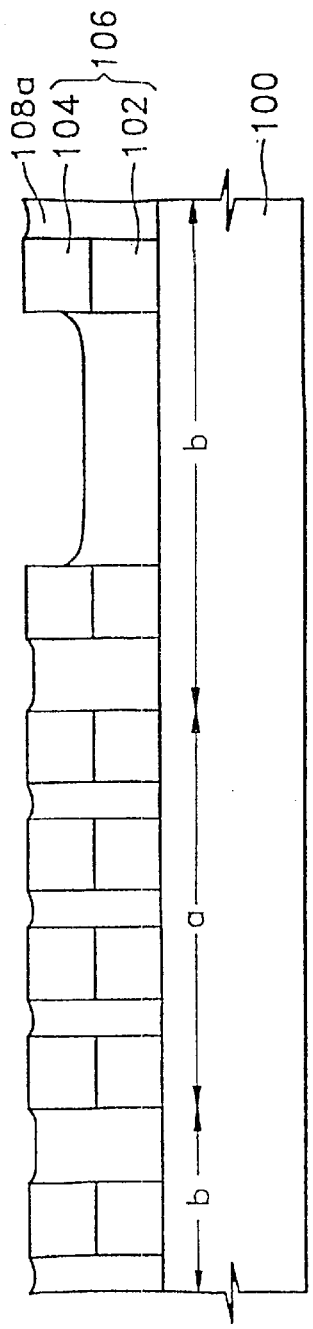

Shown in FIGS. 1 to 3 are cross-sectional views illustrating steps of a method of forming an interlevel dielectric layer of a semiconductor device according to an embodiment of the present invention. Herein, "a" denotes a cell region and "b" denotes core and periphery regions.

Referring to FIG. 1, a conductive line 106 is formed on a semiconductor substrate 100. The conductive line 106 may be a gate electrode or a bit line and have a structure in which a hard mask layer 104 is stacked on a conductive layer 102. The conductive layer 102 may be made of polysilicon, silicide or polycide, where polycide is a combination of polysilicon and silicide. The hard mask layer 104 may be made of silicon nitride. In FIG. 1, a spacer (not shown) may be formed at the side wall of the conductive line 106.

Sequentially, a spin on glass (SOG) layer 108 is deposited on the substrate 100 on which the conductive line 106 is formed. The SOG layer 108 may be a polysilazane-family material layer containing a plurality of Si—NxHy combinations.

Next, the SOG layer 108 is soft baked at a temperature of about 50–300° C. and then hard baked at a temperature of about 300–500° C.

Referring to FIG. 2, the SOG layer 108 is dry etched using e.g., a C-F-family gas having a C to F ratio of more than 0.5, until the upper part of the conductive line 106, namely, the hard mask layer 104, is exposed. It is preferable that etch gas used gives an etch selectivity ratio of the SOG layer to the silicon nitride layer of more than 10 to 1. The C-F-family gas may be selected from the group consisting of $C_5F_8$, $C_4F_8$, $C_4F_6$ and $CH_2F_2$. A C-F-family gas having a large C to F ratio (at least 0.5) reacts with the silicon nitride layer, namely, the hard mask layer 104 formed on the conductive line 106, to form polymers. The polymers may serve as an etch stop layer and therefore the conductive line 106 may be scarcely etched in etching back the SOG layer 108. In this case, the SOG layer 108 is etched to a predetermined depth based on the upper part of the conductive line 106 in the cell region "a" having high pattern density. On the other hand, the interval between lines is broad in the core and periphery regions "b". Consequently, the SOG layer 108 is etched more deeply in the core and periphery regions. In a case where a subsequent thermal process is performed in which the dry etch back process is omitted, voids or cracks are easily generated in the SOG layer 108. Therefore, it is preferable that the subsequent thermal process is performed after the SOG layer 108 is etched back and reduced to a predetermined thickness. Also, when a C-F-family gas having a low C to F ratio is used in the etch back process, the hard mask layer 104 is etched and eliminated since the selectivity ratio of the SOG layer to the silicon nitride layer, i.e., the hard mask layer 104, is low. This places a heavy burden on a subsequent etch process, for example, a self align contact (SAC) etch process. Consequently, it is preferable that a C-F-family gas having a high C to F ratio e.g., of more than 0.5 is used in the etch back process. This gives a high etch selectivity ratio of the SOG layer 108 to the silicon nitride layer e.g., of more than ten to one. Also, the unit cost of the dry etch back process is lower than that of a chemical mechanical polishing process. Moreover, in the chemical mechanical polishing process, the hard mask layer 104 may be reduced to almost the same height as the SOG layer 108 and therefore may be damaged. However, in the dry etch back process, the SOG layer 108 may be etched without damage to the hard mask layer 104.

Sequentially, the etched back SOG layer 108 is thermally treated under an atmosphere of $O_2$, $H_2O$ or a combination thereof. It is preferable that the thermal treatment is performed at a temperature of about 600–1200° C. for about 10–20 minutes. When the SOG layer 108 is thermally treated, the polysilazane-family SOG layer 108, which contains a plurality of Si—NxHy combinations, is transformed into a silicon oxide ($SiO_2$) layer due to a combination of Si and O.

Referring to FIG. 3, the resultant structure is covered with a dielectric layer 110. Next, the dielectric layer 110 is planarized and then a subsequent process is performed. The dielectric layer 110 may be one selected from the group consisting of a USG layer, a HDP layer, a PE-TEOS layer, a PSG layer or a BPSG layer. The dielectric layer 110 may be a polysilazane-family SOG layer and the interlevel dielectric layer may be formed by repeating the above described process.

According to the method of forming the interlevel dielectric layer of the semiconductor device of the present invention, the SOG layer is deposited in order to insulate the conductive line with the polysilazane-family SOG layer. Also, the SOG layer is dry etched between the baking and thermal treatment processes, using a C-F-family etch gas having a high C to F ratio, e.g., of at least 0.5 which results in a high etch selectivity ratio of the SOG layer to the silicon nitride layer, e.g., of more than ten to one. Consequently, it is possible to fill the gap between the conductive lines without the generation of voids and cracks. Moreover, in the dry etch process the hard mask layer of the conductive line is scarcely etched and therefore a burden is not placed on the subsequent SAC etch process.

Although the invention has been described with reference to an embodiment, it will be apparent to one of ordinary skill in the art that modifications of the described embodiment may be made without departing from the spirit and scope of the invention.

What is claimed is:

1. A method of forming an interlevel dielectric layer of a semiconductor device, comprising:
    (a) forming a conductive line on a semiconductor substrate, wherein the conductive line comprises a conductive layer, and an upper layer of silicon nitride disposed on the conductive layer;
    (b) forming a polysilazane-family SOG layer on the conductive line;
    (c) baking the polysilazane-family SOG layer;
    (d) etching back the polysilazane-family SOG layer, using a C-F-family etch gas having a C to F ratio of more than 0.5 and an etch selectivity ratio of the polysilazane-family SOG layer to the silicon nitride layer of more than 10 to 1, until the upper part of the conductive line is exposed; and
    (e) thermally treating the polysilazane-family SOG layer remaining after the etch back process, thereby forming a silicon dioxide layer.

2. The method of claim 1, wherein the conductive layer is made of one selected from the group consisting of polysilicon, suicide or polycide.

3. The method of claim 1, further comprising, after said forming the conductive line and before depositing the polysilazane-family SOG layers, forming a spacer at the side wall of the conductive line.

4. The method of claim 1, wherein said baking includes a step of soft baking at a temperature of about 50–300° C. and a step of hard baking at a temperature of about 300–500° C.

5. The method of claim 1, wherein said thermally treating is performed under an atmosphere selected from the group consisting of $O_2$, $H_2O$ and a combination of $O_2$ and $H_2O$ at a temperature of about 600–1200° C. for about 10–20 minutes.

6. The method of claim 1, further comprising after said thermally treating, depositing and planarizing a dielectric layer over the conductive line and the silicon dioxide layer.

7. The method of claim 6, wherein the dielectric layer is one selected from the group consisting of a USG layer, a HDP layer, a PE-TEOS layer, a PSG layer, a BPSG layer and a SOG layer.

8. A method of forming an interlevel dielectric layer of a semiconductor device, comprising:
    (a) forming a conductive line on a semiconductor substrate, wherein the conductive line comprises a conductive layer, and an upper layer of silicon nitride disposed on the conductive layer;
    (b) forming a polysilazane-family SOG layer on the conductive line;
    (c) baking the polysilazane-family SOG layer;
    (d) etching back the polysilazane-family SOG layer, using a C-F-family etch gas selected from the group consisting of $C_5F_8$, $C_4F_8$, $C_4F_6$, and $CH_2F_2$ and having an etch selectivity ratio of the polysilazane-family SOG layer to the silicon nitride layer of more than 10 to 1, until the upper part of the conductive line is exposed; and
    (e) thermally treating the polysilazane-family SOG layer remaining after the etch back process, thereby forming a silicon dioxide layer.

9. The method of claim 8, wherein the conductive layer is made of one selected from the group consisting of polysilicon, silicide or polycide.

10. The method of claim 8, further comprising, after said forming the conductive line and before depositing the polysilazane-family SOG layers, forming a spacer at the side wall of the conductive line.

11. The method of claim 8, wherein said baking includes a step of soft baking at a temperature of about 50–300° C. and a step of hard baking at a temperature of about 300–500° C.

12. The method of claim 8, wherein said thermally treating is performed under an atmosphere selected from the group consisting of $O_2$, $H_2O$ and a combination of $O_2$ and $H_2O$ at a temperature of about 600–1200° C. for about 10–20 minutes.

13. The method of claim 8, further comprising after said thermally treating, depositing and planarizing a dielectric layer over the conductive line and the silicon dioxide layer.

14. The method of claim 6, wherein the dielectric layer is one selected from the group consisting of a USG layer, a HDP layer, a PE-TEOS layer, a PSG layer, a BPSG layer and a SOG layer.

* * * * *